United States Patent
Barrett

(10) Patent No.: US 7,149,663 B1
(45) Date of Patent: Dec. 12, 2006

(54) METHOD AND APPARATUS FOR RESTRUCTURING A BINARY DECISION DIAGRAM

(75) Inventor: Geoff Barrett, Bristol (GB)

(73) Assignee: SGS-Thomson Microelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/159,748

(22) Filed: Sep. 23, 1998

(30) Foreign Application Priority Data

Sep. 29, 1997 (GB) .................................. 9720648.6

(51) Int. Cl.
G06F 7/60 (2006.01)
G06F 17/50 (2006.01)
G06F 9/06 (2006.01)

(52) U.S. Cl. .............................................. 703/2; 716/2

(58) Field of Classification Search .................... 703/2, 703/15; 717/151, 156, 132, 144; 716/4, 716/5, 8, 7, 18, 2, 16
See application file for complete search history.

(56) References Cited

U.S. PATENT DOCUMENTS

| | | | | |
|---|---|---|---|---|
| 5,243,538 A | * | 9/1993 | Okuzawa et al. ............... | 716/5 |
| 5,469,367 A | * | 11/1995 | Puri et al. ...................... | 716/18 |
| 5,477,474 A | * | 12/1995 | Southgate et al. ............ | 703/15 |
| 5,522,063 A | * | 5/1996 | Ashar et al. ................... | 716/4 |
| 5,640,328 A | * | 6/1997 | Lam .............................. | 716/8 |
| 5,649,165 A | * | 7/1997 | Jain et al. ...................... | 716/5 |
| 5,668,732 A | * | 9/1997 | Khouja et al. ................. | 702/60 |
| 5,748,486 A | * | 5/1998 | Ashar et al. ................... | 716/18 |
| 5,937,183 A | * | 8/1999 | Ashar et al. ................... | 703/15 |
| 6,035,107 A | * | 3/2000 | Kuehlmann et al. .......... | 716/18 |
| 6,086,626 A | * | 7/2000 | Jain et al. ...................... | 716/5 |
| 6,389,374 B1 | * | 5/2002 | Jain et al. ...................... | 703/2 |

OTHER PUBLICATIONS

"Dynamic Minimization of OKFDDs", Drechsler et al., IEEE 1995.*
"Representation of Switching Circuits by Binay-Decision Programs", Lee, The Bell System Technical Journal, Jul. 1959.*
"Binary Decision Digrams", IEEE 1978.*
"Graph-Based Algorithms for Boolean Function Manipulation", Bryant, IEEE 1986.*
"The Size of Reduced OBDD's and Optimal REad-One Branching Programs for Almost All Boolean Functions", Wegener, IEEE 1994.*
"Symbolic Boolean Manipulation with Ordered Binary Decision Diagrams", Bryant, ACM 1992.*
"Efficient Implementation of a BDD Package", Brace et al., IEEE 1990.*

(Continued)

Primary Examiner—Paul L. Rodriguez
Assistant Examiner—Tom Stevens
(74) Attorney, Agent, or Firm—Lisa K. Jorgenson; Daniel P. McLoughlin; Wolf, Greenfield & Sacks, P.C.

(57) ABSTRACT

A method for selecting an order in which to sift variables in a binary decision diagram. The method includes an act of arranging the variables of the binary decision diagram on nodes of a graph, with the nodes of the graph being labeled with the variables of the system such that a set of functions labeling the leaves reachable from a node correspond to the set of functions which depend on the variables labeling the node. The method further includes an act of traversing the graph in a depth first manner to produce a list of the labels in the selected order.

17 Claims, 5 Drawing Sheets

OTHER PUBLICATIONS

"On the Complexity of VLSI Implementations and Graph Representations of Boolean Functions with Application to Integer Multiplication", Bryant, IEEE 1991.*
"Logic Verification using Binary Decision Diagrams in a Logic Synthesis Environment", Malik et al., IEEE 1988.*
"Evaluation and improvement of Boolean comparison method based on binary decision diagrams", Fujita et al., IEEE 1988.*
"On Variable Ordering of Binary Decision Diagrams for the Application of Multi-level Logic Synthesis", Fujita et al., IEEE 1991.*
"Interleaving Based Variable Ordering Methods for Ordered Binary Decision Diagrams", Fujii et al., IEEE 1993.*
"Breadth-First Manipulation of Very Large Binary-Decision Diagrams", Ochi et al., IEEE 1993.*
"Novel Verification Framework Combining Structural and OBDD Methods in a Synthesis Environment", Reddy et al., ACM/IEEE 1995.*
"Minimizing ROBDD sizes of incompletely specified Boolean functions by exploiting strong symmetries", Scholl et al. IEEE Mar. 1997.*
"Linear Sifting of Decision Diagrams", Meinel et al., IEEE Jun. 1997.*
Panda et al., Who Are the Variables in Your Neighborhood, ACM 1995.*
Miller et al., Negation and Duality in Reduced Order Binary Decision Diagrams, IEEE Mar. 1997.*
Chiodo et al., Synthesis of Software Programs for Embedded Control Applications, ACM 1995.*
Panda et al., Symmetry Detection and Dynamic Variable Ordering of Decision Diagrams, ACM 1994.*
Kimura-S., "Residue BDD and Its Application to the Verification of Arithmetic Circuits" 1995 ACM, p. 1-4.*
Cockett et al., "Decision Tree Reduction" 1990 ACM p. 815-842.*
Standard Search Report issued by the European Patent Office on Feb. 17, 1998.
Rudell R.: "Dynamic Variable Ordering For Ordered Binary Decision Diagrams", IEEE/ACM International Conference On Computer Aided Design Digest Of Technical Papers (ICCAD), Santa Clara, Nov. 7-11, 1993, Conf. 11, Nov. 7, 1993, Institute Of Electrical And Electronics Engineers, pp. 42-47.
Fujii H.: "Implementation Techniques For Fast OBDD Dynamic Variable Reordering" IEICE Transactions On Fundamentals Of Electronics, Communications and Computer Sciences, vol. E78-A, No. 12, Dec. 1, 1995, pp. 1729-1734.
Bryant R.E.: "Binary Decision Diagrams And Beyond; Enabling Technologies For Formal Verification" 1995 IEEE/ACM International Conference On Computer-Aided Design (ICCAD), San Jose, Nov. 5-9, 1995, pp. 236-243.
Butler K.M., et al.: "Heuristics To Compute Variable Orderings For Efficient Manipulation Of Ordered Binary Decision Diagrams" Proceedings Of The ACM/IEEE Design Automation Conference, San Francisco Jun. 17-21, 1991, Conf. 28, Institute Of Electrical and Electronics Engineers, pp. 417-420.
Examination Report from corresponding European Application No. 98307486.5, dated Dec. 1, 2004.
Rudell, R., *Dynamic Variable Ordering for Ordered Binary Decision Diagrams*, IEEE/ACM International Conference on Computer Aided Design Digest of Technical Papers (ICCAD), Santa Clara, Nov. 7-11, 1993, No. Conf. 11, Nov. 7, 1993, pp. 42-47, Institute of Electrical and Electronics Engineers, XP000462999.
Bryant R.E., *Binary Decision Diagrams and Beyond; Enabling Technologies for Formal Verification*, 1995 IEEE/ACM International Conference on Computer Aided Design Digest of Technical Papers (ICCAD), San Jose, Nov. 5-9, 1995, pp. 236-243, Institute of Electrical and Electronics Engineers, XP000620913.

* cited by examiner

METHOD AND APPARATUS FOR RESTRUCTURING A BINARY DECISION DIAGRAM

BACKGROUND OF INVENTION

1. Field of Invention

The present invention relates to a method and apparatus for reducing the complexity of a representation of a hardware system.

2. Description of the Prior Art

The first stage in synthesizing and proving the properties of a system is a compilation process in which the system is modeled by representation as a set of functions comprising a first subset of functions which determines the value of system outputs as a function of system inputs, system states represented by state bits, and internal signals; a second subset of functions which determines the values of state bits on the next clock cycle as a function of system inputs, system states represented by state bits, and internal signals; and a third subset of functions which determines the values of internal signals as a function of system inputs, system states, and internal signals.

To enable or accelerate formal proof of the system and its properties, internal signals may be eliminated from the system model by substituting them into the functions which refer to them. In the course of this substitution, the representation of the model may become extremely large. If this occurs, it is possible to detect an explosion in the size of the representation and to suspend the substitution process while restructuring the representation to seek a reduction in size.

Typically in a compilation process, static relationships between signals in the system model can be destroyed by dynamic restructuring operations. This can lead to a further explosion later during the substitution process.

It would be advantageous to take static relationships into account during the dynamic restructuring process.

One technique of representing functions and internal signals is by the use of binary decision diagrams (BDD's). A binary decision diagram is a representation of a digital function which contains the information necessary to implement the function. The diagram is a tree-like structure having a root and plural nodes, where the root represents the digital function and the nodes are labeled with variables. Each node has two branches, one representing the assertion that the variable labeling the node is 1, and the other representing the assertion that the variable labeling the node is 0. In a BDD, "ordering" relates to the order in which variable names are encountered during traversal of the graph. Better orderings result in fewer nodes in the graph.

SUMMARY OF INVENTION

According to a first aspect of the present invention, there is provided a method for selecting an order in which to sift variables in a binary decision diagram comprising arranging the variables of the binary decision diagram on the nodes of a graph in which the nodes are labeled with the variables of the system such that the set of functions labeling leaves reachable from a node correspond to the set of functions which depend on the variables labeling the node; and traversing the graph in a depth first manner, thereby to produce a list of the labels in the selected order.

According to a second aspect of the present invention there is provided an apparatus for selecting an order in which to sift variables in a binary decision diagram comprising a first store storing bits representing the variables of the binary decision diagram; a second store; and a processor adapted to arrange the variables of the binary decision diagram in a representation of the nodes of a graph in which the nodes are labeled with the variables such that the set of functions labeling leaves reachable from a node corresponds to the set of functions which depend on the variables labeling the node; and to traverse the graph in a depth-first manner such that the processor outputs to the second store a list of labels in the selected order.

According to a third aspect of the present invention there is provided a method for restructuring a binary decision diagram representative of a hardware system, comprising arranging variables of the binary decision diagram on nodes of a graph in which the nodes are labeled with the variables of the system such that the set of functions labeling leaves reachable from a node corresponds to the set of functions which depend on the variables labeling the node; and traversing the graph in a depth-first manner to produce a list of labels in a selected order; using the selected order, controlling sifting of each variable.

Preferably the variables are sifted one-by-one to a deepest best location. Advantageously the variables are sifted one-by-one in the selected order to a deepest best location followed by sifting in reverse order to a shallowest best location.

According to a fourth aspect of the present invention there is provided apparatus for restructuring a binary decision diagram comprising storage circuitry for storing bits representative of a set of functions as binary decision diagrams having a plurality of nodes labeled by variables; a processor for detecting a number of nodes of the binary decision diagram, and in response to such detection, arranging the variables of the binary decision diagram on the nodes of a graph in which the nodes are labeled such that the set of functions labeling leaves reachable from a node corresponds to the set of functions which depend on the variables labeling the node, traversing the graph in a depth-first fashion to produce a list of labels in a selected order and using the selected order, controlling sifting of the variables of the binary decision diagrams; wherein the sifted binary decision diagram is written by the processor to the storage circuitry. According to a fifth aspect of the present invention there is provided a method for proving properties of a hardware system comprising representing the system as binary decision diagrams having a plurality of nodes labeled by variables; substituting functions which determine variables of internal signals; arranging the variables of a binary decision diagram on the nodes of a graph in which the nodes are labeled with the variables of the system such that the set of functions labeling leaves reachable from a node corresponds to the set of functions which depend on the variables labeling the node; traversing the graph in a depth-first manner to produce a list of the labels in a selected order; and using the selected order, controlling sifting of each variable.

According to a sixth aspect of the present invention there is provided apparatus for proving properties of a hardware system comprising storage circuitry for storing bits representative of a set of functions which represent the hardware system as binary decision diagrams having a plurality of nodes labeled by variables; processor means for substituting functions which determine values of internal signals into the set of functions representing the system and detecting an increase in the number of nodes of the binary decision diagram, and, in response to such detection arranging the variable of the binary decision diagram on the nodes of a graph in which the nodes are labeled with the variables of the system such that the set of functions labeling leaves reachable from a node corresponding to the set of functions which depend on the variables labeling the node, traversing the graph in a depth-first fashion to produce a list of labels in the selected order, and using the selected order controlling sifting of the variables of the binary decision diagram; and further comprising a second store, wherein the sifted binary decision diagram is written by the processor means to the second store.

Preferably the number is a threshold derived from an original number of nodes. Alternatively the number is the number of nodes which branches on a predetermined variable. Alternatively the number is an absolute number.

BRIEF DESCRIPTION OF THE DRAWINGS

An embodiment of the present invention will now be described with respect to the following drawings in which.

DESCRIPTION OF THE PREFERRED EMBODIMENTS

A Binary Decision Diagram (hereinafter referred to as a BDD) is a directed acyclic graph representative of a Boolean function as a decision procedure based on the variables on which it depends. For instance, for the function:

f=xORy, f can be implemented by the decision procedure "if x then true else if y then true else false". Each of the "if . . . then . . . else . . . " constructs of this decision procedure can be represented as a node in a graph.

Figure 1:
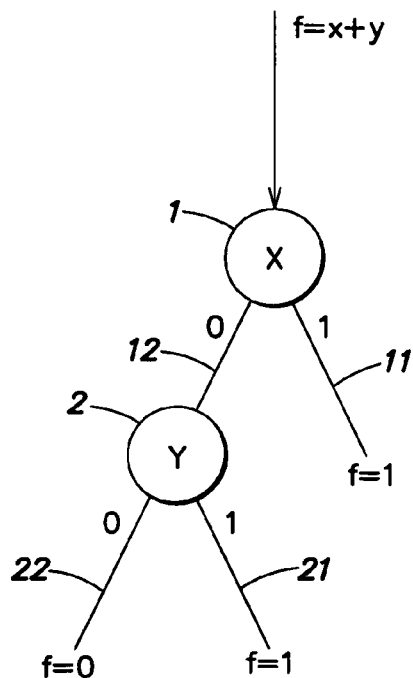
FIG. 1 shows a binary decision diagram for the function f=xORy.

Referring to FIG. 1, the first node 1 is labeled with the variable x and there are two branches from this first node, one 11 is "true" and the other 12 is "if y then true else false". This other branch 12 leads to a second node 2 which is labeled with the variable y, which in turn has two branches 21, 22 of which one is "true" and the other is "false".

It will be understood that although the nodes 1 and 2 are described above as being labeled with variables, nevertheless these labels could in fact refer to functions which upon evaluation would give rise to the logical values "true" or "false".

Figure 2:
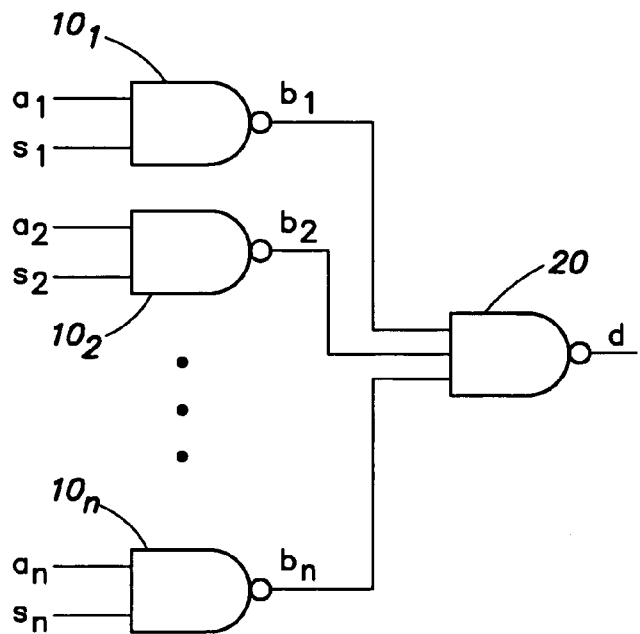
FIG. 2 shows a logical diagram of a multiplexer.

Referring now to FIG. 2, a multiplexer consists of a first set of n NAND gates $10_1$–$10_n$, each gate having two respective inputs $a_1$–$a_n$, $s_1$–$s_n$. The outputs, lines $b_1$ and $b_n$ of the gates, are connected to an n-input NAND gate 20 having an output d.

Thus, in terms of a system as described in the preamble to this patent application, the multiplexer of FIG. 2 has system inputs $a_1$–$a_n$, $s_1$–$s_n$, internal signals ($b_1$–$b_n$) and a system output (d). The output d is related to the internal signals $b_1$–$b_n$ by the equation:

$d$=NOT($b_1$AND$b_2$AND$b_3$ ... $b_n$), and each internal signal $b_i$ to the respective inputs $a_i$ and $s_i$ by the equation:

$b_i$=NOT($a_i$AND$s_i$).

Thus, $d$=($a_1$AND$s_1$)OR($a_2$AND$s_2$)OR ... ($a_n$AND$s_n$).

Figure 3:
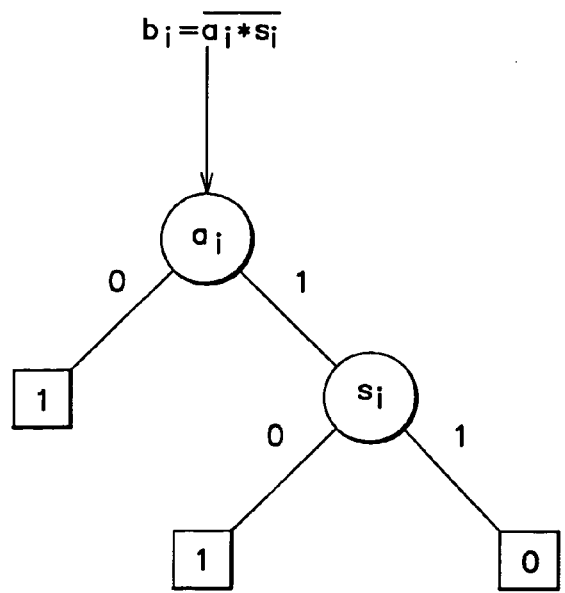
FIG. 3 shows a binary decision diagram for the equation $b_i$=NOT($a_i$AND$s_i$)

Referring to FIG. 3 the relationship $b_i$=NOT ($a_i$ AND $s_i$) is shown as a binary decision diagram.

Figure 4:
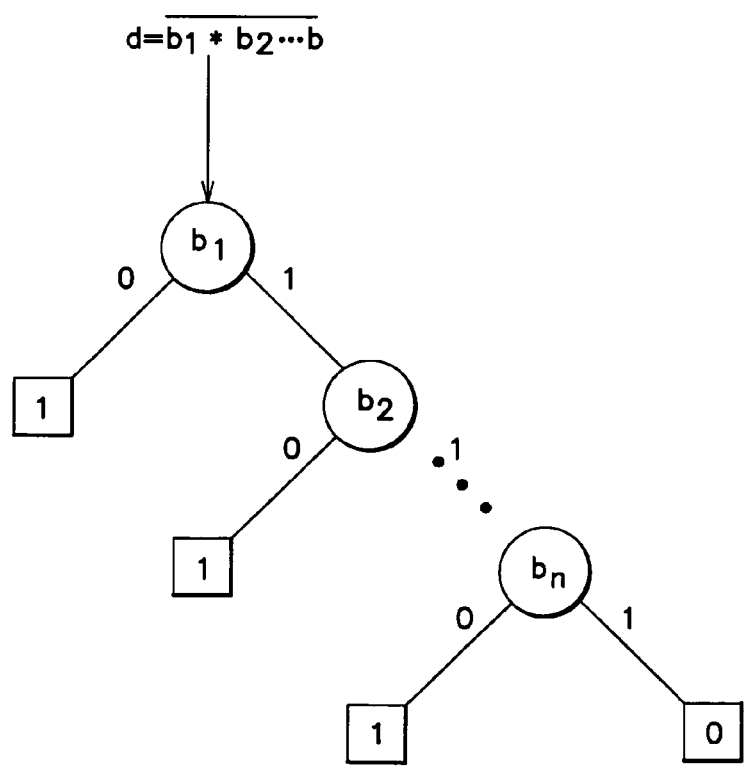
FIG. 4 shows the binary decision diagram for the equation $d$=NOT($b_1$AND$b_2$AND$b_3$ ... $b_n$)

FIG. 4 shows the binary decision diagram representation of the expression for d in terms of the internal signals b.

By inspection, there are 3n variables ($a_i$, $s_i$ and $b_i$) and there are thus (3n)! apparently equally good orderings possible. However, by inspection of the overall equation for the device it would be seen that $a_1$ and $s_1$ are associated together, $a_2$ and $s_2$ are associated together and so on which means that there are in fact only n! orderings which are optimal for the entire system.

An advantage of the present invention is that it enables more information about the system as a whole to be taken into account when performing operations which would otherwise not take this information into account. Failing to take the information into account can result in following paths which do not lead to a solution, or which are highly inefficient in reaching the solution.

Figure 5:
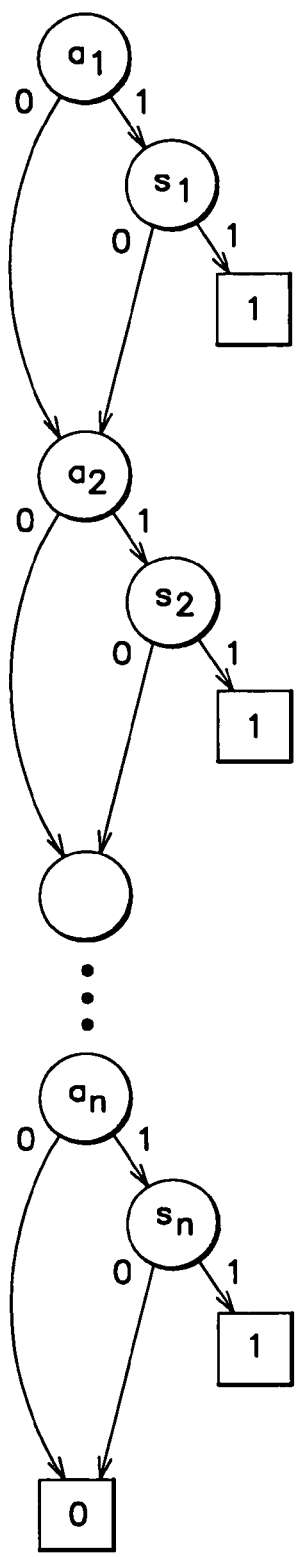
FIG. 5 is an optimally ordered substitution of the equations of FIGS. 3 and 4.

FIG. 5 shows a binary decision diagram for the multiplexer of FIG. 2 in which the respective pairs of inputs are associated together.

The size of a binary decision diagram is sensitive to the order in which the variables are inspected, and efficient BDD reordering is very important. One algorithm for reordering is "sifting", wherein each variable is taken in turn and the best position of it is found by trying it in every possible position of the BDD. It is then necessary to decide which variable to take first. A known and frequently successful tool for doing this is to rank the variables according to which variable labels the greatest number of nodes and then to sift in the order of ranking.

In the present BDD, it is clear that each variable labels a single node and thus it would not be possible using known techniques to identify a highest ranking variable. Conventionally, in such a situation, an arbitrary order for sifting would be used.

The present invention makes use of a function graph which is traversed to determined an order for sifting.

As used herein, a function graph is a directed acyclic graph where the leaves are labeled with functions and the nodes are labeled with sets of variables (non-empty). The only restriction put on this graph is that a variable which is in the set labeling a node is in the "cone" of all the functions at the leaves below it and no others. This restriction plus the fact that the sets of variables must be non-empty, is enough to ensure that the graph is unique. The "cone" of a function is herein defined to be all those variables on which a function depends, either directly or through the intermediate signals on which it depends.

Using a function graph to define an ordering of the variables in a BDD to minimize its size may be related to the register allocation technique used in software compilation in that the ordering of the variables is derived from a traversal of the function graph in such a way that no node is visited before all of its predecessors has been visited, but each node is visited as soon as all its predecessors have been visited, unless there is a race between more than one node, in which case one of the competing nodes is chosen and its subgraphs traversed first.

Figure 6:
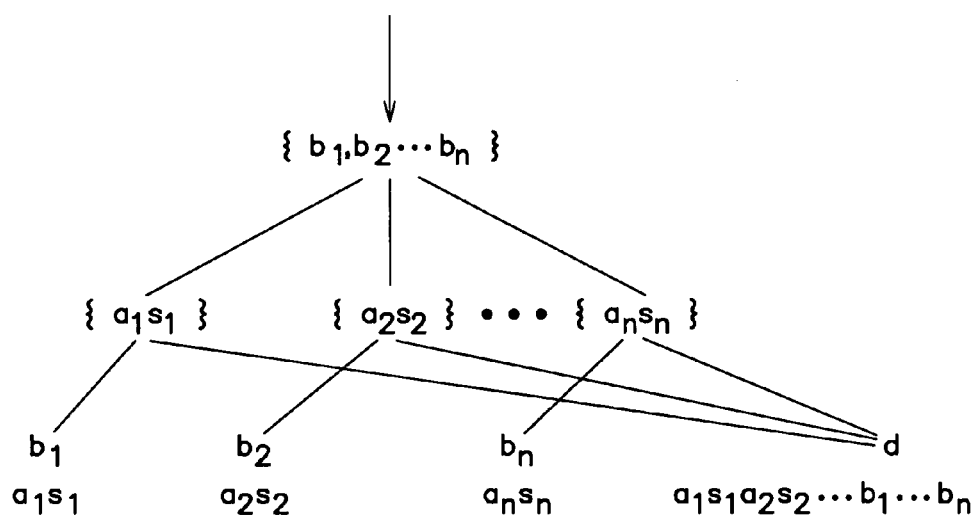
FIG. 6 shows a graph of relationships between the variables of the multiplexer of FIG. 2.

FIG. 6 shows a function graph for the multiplexer of FIG. 2 having a root labeled by $b_1$–$b_n$, intermediate nodes labeled by $a_1, s_1, a_2, s_2 \ldots a_n, s_n$ and leaves as shown. Traversing this function graph from the top down gives the order:

$b_1, b_2 \ldots b_n, a_1, s_1, a_2, s_2 \ldots a_n, s_n$.

By using this order which is derived from static information of the system, the binary decision diagrams of (in this case) FIGS. 1, 3 and 4 are sifted to provide an optimal order. This order is that represented by FIG. 5.

It should be noted that substitution may be effected without restructuring the BDD, while monitoring the size of the BDD. If an explosion in BDD is detected, sifting is then effected on the basis of the order provided by the present invention.

Figure 7:
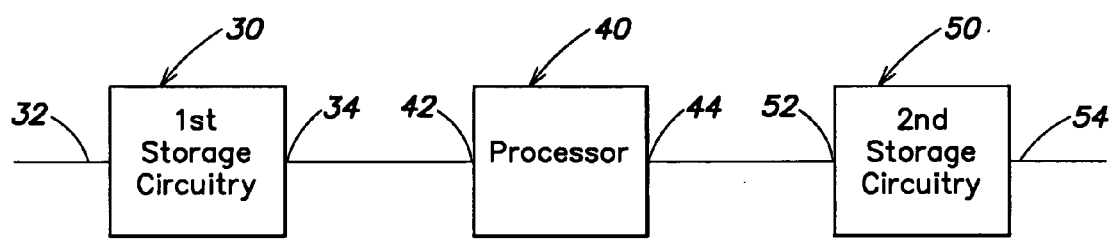
FIG. 7 shows an example of apparatus arranged to implement an embodiment of the present invention.

FIG. 7 shows an example of apparatus to implement an embodiment of the present invention. A first storage circuitry 30 stores data representative of the variables of a binary decision diagram.

The first storage circuitry has an input 32 for receiving the variables. The output 34 of the first storage circuitry is coupled to an input 42 of a processor 40. The processor receives the variables via the output 34 of the first storage circuitry and constructs a function graph by arranging the variables in a representation of the nodes of the graph such that the nodes are labeled with the variables so that the set of functions labeling leaves reachable from a node corresponds to the set of functions which depend on the variables labeling the node, as shown in FIG. 6. The processor then traverses the graph in a depth-first manner, as indicated in FIG. 6 by the arrow, to construct a list of the labels in a selected order. The list is output from the processor via output 44 which is coupled the input 52 of second storage circuitry.

Figure 8:
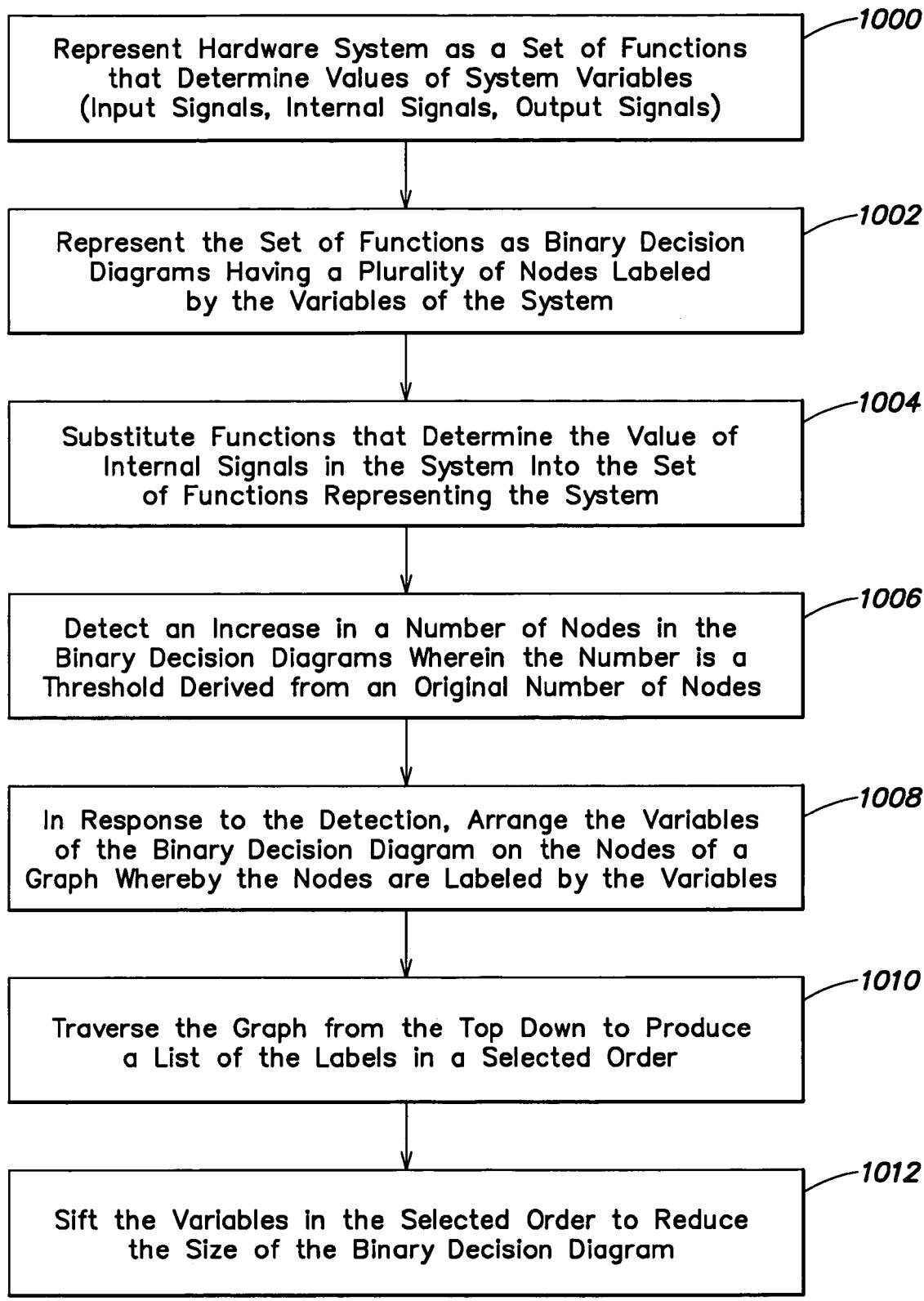
FIG. 8 shows a flow diagram indicating the features of an embodiment of the present invention.

FIG. 8 illustrates an exemplary process for restructuring a BDD that represents a hardware system as described above. In act 1000, the hardware system is represented as a set of functions that determine values of system variables (input signals, internal signals, output signals). In act 1002, the set of functions is represented as binary decision diagrams having a plurality of nodes labeled by the variables of the system. In act 1004, functions that determine the value of internal signals in the system are substituted into the set of functions representing the system. When an increase in a number of nodes in the binary decision diagram is detected in act 1006, wherein the number is a threshold derived from an original number of nodes, the process proceeds to act 1008. In act 1008, in response to the detection at act 1006, processor 40 arranges the variables of the binary decision diagram on the nodes of a graph whereby the nodes are labeled by the variables. In act 1010, the graph is traversed from the top down to produce a list of the labels in a selected order, and in act 1012, the variables are sifted in the selected order to reduce the size of the binary decision diagram. In act 1012, the variables are sifted one-by-one to a deepest best location and then sifted in reverse order to a shallowest best location.

While the invention has been previously shown and described with reference to a preferred embodiment, it will be understood by those skilled in the art that various changes in form and detail may be made therein without departing from the spirit and scope of the invention.

What is claimed is:

1. A method of ordering variables of a binary decision diagram representation of a hardware system, comprising acts of:
   arranging the variables of the binary decision diagram in a representation of a graph, corresponding to the hardware system, the graph having a top, nodes and leaves, the nodes being labeled with the variables of the binary decision diagram and the leaves being labeled with a set of functions, thereby to generate labels for the nodes and leaves, whereby the set of functions labeling the leaves reachable from one of the nodes corresponds to the set of functions that depend on the variables labeling the one of the nodes;
   traversing the representation of the graph from the top down to produce a list of labels in a selected order; and
   using the selected order of the list to determine a sifting order in which the variables are to be sifted to restructure the binary decision diagram representation of the hardware system prior to sifting the variables.

2. An apparatus for ordering variables of a binary decision diagram representation of a hardware system, comprising:
   a first storage circuit to store first bits representing the variables of the binary decision diagram;
   a second storage circuit; and
   a processor, coupled to the first storage circuit and the second storage circuit, programmed to arrange the variables of the binary decision diagram in a representation of a graph having a top, nodes, and leaves, and to generate labels for the nodes and leaves, the nodes being labeled with the variables of the binary decision diagram and the leaves being labeled with a set of functions, the set of functions labeling the leaves reachable from one of the nodes corresponding to the set of functions which depend on the variables labeling the one of the nodes, the processor also being programmed to traverse the representation of the graph from the top down, and to output to the second storage circuit a list of labels in a selected order based upon traversal of the representation of the graph prior to sifting the variables according to the selected order.

3. A method of restructuring a binary decision diagram representative of a hardware system, the binary decision diagram including a plurality of variables, the method comprising acts of:
   arranging variables of the binary decision diagram in a representation of a graph corresponding to the hardware system, the graph having a top, nodes, and leaves, to generate labels for the nodes and leaves, the nodes being labeled with the variables of the binary decision diagram and the leaves being labeled with a set of functions, the set of functions labeling the leaves reachable from one of the nodes corresponding to the set of functions which depend on the variables labeling the one of the nodes;
   traversing the representation of the graph from the top down to produce a list of the labels in a selected order;
   sifting the variables based on the selected order; and
   restructuring the binary decision diagram based on the act of sifting the variables.

4. The method of claim 3, wherein the variables are sifted one-by-one to a deepest location.

5. The method of claim 3, wherein the variables are sifted one-by-one in the selected order to a deepest location followed by sifting in reverse order to a shallowest location.

6. An apparatus for restructuring a binary decision diagram representative of a hardware system, comprising:

storage circuitry for storing bits representative of a set of functions as a binary decision diagram corresponding to the hardware system, the binary decision diagram having a plurality of nodes, the nodes being labeled with variables to provide labels for the nodes; and a processor adapted to detect a number of nodes of the binary decision diagram, and in response to the detection, arranging the variables of the binary decision diagram in a representation of a graph having a top, nodes and leaves, to generate labels for the nodes and leaves, the nodes being labeled with the variables of the binary decision diagram and the leaves being labeled with a set of functions, the set of functions labeling the leaves reachable from one of the nodes corresponding to the set of functions which depend on the variables labeling the one of the nodes, traversing the representation of the graph from the top down, to produce a list of the labels in a selected order, and sifting the variables of the binary decision diagram based on the selected order, wherein the sifted variables are written by the processors to the storage circuitry.

7. A method for proving the properties of a hardware system, the hardware system comprising a plurality of internal signals, wherein a plurality of functions determine variables of the internal signals, the method comprising acts of:

representing the hardware system as a binary decision diagram having a plurality of nodes, the nodes being labeled with variables to provide labels for the nodes;

substituting the functions which determine the variables of the internal signals;

arranging the variables of the binary decision diagram in a representation of a graph having a top, nodes and leaves, the nodes being labeled with the variables of the system and the leaves being labeled with a set of functions to generate labels for the nodes and leaves, whereby the set of functions labeling the leaves reachable from one of the nodes corresponds to the set of functions which depend on the variables labeling the one of the nodes;

traversing the representation of the graph from the top down to produce a list of the labels in a selected order; and sifting the variables of the binary decision diagram based on the selected order.

8. An apparatus for proving properties of a hardware system, the hardware system comprising a plurality of internal signals, wherein a plurality of functions determine values of the internal signals, the apparatus comprising:

first storage circuitry for storing bits representative of a set of functions which represent the hardware system as a binary decision diagram having a plurality of nodes, the nodes being labeled with variables to provide labels for the nodes;

a processor that substitutes the functions which determine the values of the internal signals into the set of functions representing the system and detects an increase in a number of the nodes of the binary decision diagram, and in response to the detection, arranges the variables of the binary decision diagram a representation of a graph having a top, nodes and leaves, the nodes being labeled with the set of functions to generate labels for the nodes and leaves, whereby the set of functions labeling the leaves reachable from one of the nodes corresponds to the set of functions which depend on the variables labeling the one of the nodes, traverses the labels in a selected order and sifts the variables of the binary decision diagram based on the selected order; and second storage circuitry, wherein the sifted variables of the binary decision diagram are written by the processor to the second storage circuitry.

9. The apparatus of claim 8, wherein the number is a threshold derived from an original number of nodes.

10. Apparatus as claimed in claim 8, wherein the number is a number of nodes which branch on a predetermined variable.

11. The apparatus of claim 8, wherein the number is an absolute number.

12. The method of claim 1, wherein one or more of the acts of arranging, traversing and using are implemented using a computer.

13. The method of claim 12, wherein the acts of arranging, traversing and using are implemented using a computer.

14. The method of claim 3, wherein one or more of the acts of arranging, traversing, sifting and restructuring are implemented using a computer.

15. The method of claim 14, wherein the acts of arranging, traversing, sifting and restructuring are implemented using a computer.

16. The method of claim 7, wherein one or more of the acts of arranging, traversing and sifting are implemented using a computer.

17. The method of claim 16, wherein the acts of arranging, traversing and sifting are implemented using a computer.

* * * * *

UNITED STATES PATENT AND TRADEMARK OFFICE
CERTIFICATE OF CORRECTION

PATENT NO.       : 7,149,663 B1                                         Page 1 of 1
APPLICATION NO.  : 09/159748
DATED            : December 12, 2006
INVENTOR(S)      : Geoff Barrett It is certified that error appears in the above-identified patent and that said Letters Patent is hereby corrected as shown below:

Claim 8, column 8, line 13 should read:
--of the binary decision diagram in a representation of a--

Signed and Sealed this

Sixth Day of March, 2007

JON W. DUDAS
*Director of the United States Patent and Trademark Office*